(12) United States Patent
Wieland et al.

(10) Patent No.: US 8,903,246 B2
(45) Date of Patent: Dec. 2, 2014

(54) FLEXIBLY CONFIGURABLE OPTICAL SUB-ASSEMBLY

(75) Inventors: Jörg Wieland, Küsnacht (CH); Martin Bossard, Zürich (CH)

(73) Assignee: GigOptix-Helix AG, Zurich (CH)

( * ) Notice: Subject to any disclaimer, the term of this patent is extended or adjusted under 35 U.S.C. 154(b) by 261 days.

(21) Appl. No.: 13/234,201

(22) Filed: Sep. 16, 2011

(65) Prior Publication Data

US 2012/0070155 A1    Mar. 22, 2012

(30) Foreign Application Priority Data

Sep. 17, 2010   (EP) .................................... 10405175

(51) Int. Cl.
  *H04B 10/00*   (2013.01)
  *G02B 6/42*    (2006.01)
  *H01S 5/022*   (2006.01)

(52) U.S. Cl.
  CPC ............ *G02B 6/4246* (2013.01); *G02B 6/4274* (2013.01); *G02B 6/4263* (2013.01); *H01S 5/02212* (2013.01)
  USPC ............................. 398/135; 398/138; 398/164

(58) Field of Classification Search
  USPC .......................................... 398/135, 138, 164
  See application file for complete search history.

(56) References Cited

U.S. PATENT DOCUMENTS

| | | | |
|---|---|---|---|
| 6,937,824 B2* | 8/2005 | Watanabe | 398/135 |
| 7,215,891 B1* | 5/2007 | Chiang et al. | 398/137 |
| 7,269,357 B2* | 9/2007 | Case et al. | 398/135 |
| 7,532,820 B2* | 5/2009 | Aronson | 398/135 |
| 7,912,383 B2* | 3/2011 | Cheng et al. | 398/210 |
| 8,161,332 B2* | 4/2012 | Skirmont et al. | 714/704 |
| 8,331,791 B2* | 12/2012 | Hong | 398/137 |
| 2005/0084268 A1 | 4/2005 | Weigert | |
| 2005/0129372 A1 | 6/2005 | Zheng | |
| 2009/0116845 A1* | 5/2009 | Li et al. | 398/135 |
| 2009/0138709 A1* | 5/2009 | Ekkizogloy et al. | 713/168 |
| 2009/0202256 A1 | 8/2009 | Chen | |
| 2009/0240945 A1* | 9/2009 | Aronson | 713/176 |
| 2010/0215359 A1* | 8/2010 | Li et al. | 398/22 |
| 2013/0129359 A1* | 5/2013 | Zbinden et al. | 398/135 |

OTHER PUBLICATIONS

Kropp et al., "A small form-factor and low-cost opto-electronic package for short-reach 40 Gbit/s serial speed optical data links," Electronic System-Integration Technology Conference (ESTC), Sep. 13, 2010, pp. 1-4, XP031806692.

* cited by examiner

*Primary Examiner* — Dalzid Singh
(74) *Attorney, Agent, or Firm* — Crowell & Moring LLP

(57) ABSTRACT

Multiple pins extend from the outside to the inside of an optical sub-assembly. A light receiver or a light transmitter is arranged inside the optical sub-assembly. A receiver circuit and transmitter circuit (TX) are arranged inside the optical sub-assembly and connected between the multiple pins and the light receiver and the light transmitter. The receiver circuit comprises a receiver communication interface in order to transform an output signal of the light receiver into a communication signal, and wherein the transmitter circuit comprises a transmitter communication interface to transform a communication signal into an input signal of the light transmitter. A control interface is connected with the receiver circuit and the transmitter circuit arranged inside the optical sub-assembly, wherein the control interface is connectable to two of the multiple pins.

13 Claims, 8 Drawing Sheets

FLEXIBLY CONFIGURABLE OPTICAL SUB-ASSEMBLY

TECHNICAL FIELD

The invention relates to an optical sub-assembly, particularly a TO-can, comprising:
a) multiple pins extending from the outside to the inside of the optical sub-assembly;
b) a light receiver or a light transmitter arranged inside the optical sub-assembly; and
c) a receiver circuit respectively a transmitter circuit arranged inside the optical sub-assembly and connected between the multiple pins and the light receiver respectively the light transmitter, wherein the receiver circuit comprises a receiver communication interface in order to transform an output signal of the light receiver into a communication signal, wherein the transmitter circuit comprises a transmitter communication interface in order to transform a communication signal into an input signal of the light transmitter.

BACKGROUND ART

In fiber optic communication systems, transmitting optical subassemblies (TOSA) and receiving optical subassemblies (ROSA) are employed in order to transmit and receive optical signals over optical cables. For example, a ROSA or TOSA comprises a TO-can (TO: transistor outline) with a multi-pin sub-assembly package in order to house a laser or a photodiode. Widely used are 4-pin, 5-pin, or 6-pin TO-cans. The multiple pins of a TO-can are designed to receive an analog transmit signal in order to control the transmission of light by a laser or to deliver an analog receive signal in correspondence of light detected by a photodiode. A TOSA or ROSA comprises a TO-can and attached thereto a cap or flange, such that an optical cable can be precisely connected and a precise transition of light is established between the laser and the optical cable, respectively between the optical cable and the photodiode.

The multiple pins of a TOSA or a ROSA are electrically connected to a PCB (PCB: printed circuit board). In widely used applications, a TOSA is arranged beside a ROSA, in order to arrange for transmitting and receiving capabilities on the same PCB. The PCB comprises electronic driver circuits, which build an interface to a communication interface designed to be connected to a corresponding interface of a computer, for example. The PCB is arranged in a housing, such that an optical transceiver module is obtained, which has on one side an electrical interface for the connection to a electronic equipment and on the other side an optical interface for the connection to optical cables.

US 2010/0054754 discloses a 5-pin receiver optical sub-assembly (ROSA), wherein two pins are connected to a voltage source, two pins are output pins that output a differential output signal and one pin is a dual-purpose pin. A photodetector generates an electrical signal, which is converted with an optical data receiver circuit into a digital data stream that is transmitted out of the ROSA via the two output pins as a differential signal. External to the ROSA, a light level monitor circuit is connected to the dual-purpose pin. A 5-pin transmitter optical sub-assembly (TOSA) includes an optical data transmitter circuit with a differential buffer, a driver and a light emitting device. The differential buffer is configured to receive a differential data signal stream that is fed into TOSA via two input pins. It is converted to a single-ended data stream, which is coupled into the driver in order to drive the light emitting device, which may be a laser.

Currently available optical sub-assemblies are designed for a particular application. Hence, for each application a specially designed optical sub-assembly has to be developed and produced. In currently available optical sub-assemblies, various circuits like a TIA (TIA: transimpedance amplifier) or circuits for transforming between a RF signal (RF: radio frequency) and a binary data stream are arranged directly within the optical sub-assembly. However, when using currently available optical sub-assemblies in transceiver modules, the need for additional external circuits remains still high, particularly in order to monitor operation of the optical sub-assembly and generate required control signals.

SUMMARY OF THE INVENTION

It is the object of the invention to create an optical sub-assembly pertaining to the technical field initially mentioned, that is flexibly configurable for various applications and requires only a minimal number of external components.

The solution of the invention is specified by the features of claim 1. According to the invention a control interface connected with the receiver circuit respectively the transmitter circuit is arranged inside the optical sub-assembly, wherein the control interface is connectable to one or more of the multiple pins of the optical sub-assembly.

The optical sub-assembly has several pins connectable to a PCB (PCB: printed circuit board) on one side. On the other side, optical fibres may be connected through an optical connector. Preferably, the optical sub-assembly comprises a TO-can, which may be fabricated in metal, plastic or any other material. The optical sub-assembly according to the invention is capable to directly convert a communication signal into a corresponding optical signal respectively to directly convert an optical signal into a corresponding communication signal. The communication signal may be an analog RF signal (RF: radio frequency) or a binary data stream, wherein the receiver communication interface and/or the transmitter communication interface are designed accordingly. When the communication signal relates to an analog RF signal, the optical sub-assembly will typically be arranged together with further RF components and a binary data interface on a PCB (PCB: printed circuit board). When the communication signal relates to a binary data stream, the optical sub-assembly may be arranged on a PCB without further components. Only dumb RF tracks are required and usage of additional components is further minimized. The optical sub-assembly according to the invention comprises a control interface connectable between the transceiver circuit respectively the receiver circuit and two pins of the optical sub-assembly. By reading and writing control data on the control interface, i.e. the respective pins of the optical sub-assembly, operation of the optical sub-assembly may be monitored and controlled. Accordingly, the control interface is designed to allow both for reading and writing control data on the interface. Hence, the optical sub-assembly may be flexibly used for various different applications. For example, the receiver circuit of an optical sub-assembly may be designed to be used for different data rates, which may be chosen by writing corresponding data on the control interface. In another example, the transmitter circuit of an optical sub-assembly may be designed to provide a signal detect event when an optical signal is received, which may be read out according to corresponding data on the control interface.

The light receiver may be implemented by a photodiode. The light transmitter may be implemented by a laser, particularly by a vertical cavity surface emitting laser (VCSEL). The receiver circuit and the transmitter circuit may be implemented by an integrated circuit, particularly by a CMOS circuit using a 0.13µ technology. However, any integrated circuit technology may be used. The analog interface and the control interface may both be implemented on the same integrated circuit as the receiver circuit and the transmitter circuit. However, it is also possible to implement some or all of the required components and circuits on one or more different integrated circuits or electronic components.

The analog interface is designed to deliver an analog signal which is proportional to an operational state of the light receiver, the light transmitter, the receiver circuit, the transmitter circuit, or any other component. For example, the analog signal delivers a current or a voltage which is proportional to the current in the light receiver, the current in the light transmitter, the temperature of the light transmitter, or to an electrical or physical quantity of any other component.

In a preferred embodiment, an analog interface connected with the receiver circuit respectively the transmitter circuit is arranged inside the optical sub-assembly, wherein the analog interface is connectable to one or more of the multiple pins of the optical sub-assembly. Depending on the application, for the operation of the optical sub-assembly it is sufficient in some configurations to monitor a temperature or a current delivered to the light transmitter or received from the light receiver. In other applications, monitoring and/or controlling of the optical sub-assembly through a control interface is required. Accordingly, in the optical sub-assembly according to the invention both an analog interface and a control interface are provided, wherein according to the requirements of an application, the analog interface and/or the control interface can be connected to the pins of the optical sub-assembly in order to provide for monitoring and/or controlling of the optical sub-assembly. Hence, no further components are required in order to provide for functionalities required in various applications. Accordingly, even further advantages with respect to efficiency, costs, and size are provided.

Preferably the control interface is an I2C control interface (I2C: inter-integrated circuit; serial interface developed by Philips Semiconductors, since 1 Oct. 2006 freely implementable), which is connectable to two pins of the optical sub-assembly. The interface according to the I2C is also known as TWI (two-wire interface). It has serial data speeds of 100 kbit/s, 400 kbit/s, 1 Mbit/s and 3.4 Mbit/s and supports an address space of up to 10 bit. It is a widely used technology. Therefore, a wide variety of components are readily available in order to be connected to pins of the optical sub-assembly for transferring data to and from further equipment in order to monitor and control the optical sub-assembly.

Alternatively, the control interface is any other control interface, like, for example, any other serial interface or a parallel interface. Depending on the serial or parallel interface, components may be available less widely and correspondingly the costs or the complexity to build an optical sub-assembly or transceiver may not be as low as required.

In a preferred embodiment, in case of a transmitter circuit, the analog interface is connectable to one pin of the optical sub-assembly and provides for a signal proportional to the current delivered to the light transmitter, for a signal proportional to an average current delivered to the light transmitter, for a signal proportional to a current of a feedback light receiver arranged nearby the light transmitter, or for a signal proportional to a temperature measured by a temperature sensor. In some applications, it may be required that the current of the light transmitter or its temperature is monitored, such that the communication signal may be appropriately adapted or controlled.

Alternatively, the analog interface is not connected to a pin of the optical sub-assembly. In this case, however, monitoring of the optical sub-assembly is performed by the control interface, which requires corresponding control components. Correspondingly, external components cannot be minimized. However, through the control interface controlling of the optical sub-assembly is flexibly configurable for various applications.

Preferably, in case of a receiver circuit the analog interface is connectable to one pin of the optical sub-assembly and provides for a signal proportional to the current of the light receiver, or for a signal proportional to a temperature measured by a temperature sensor. In some applications, it may be required that the current of the light receiver is monitored, whereby, for example, the communication signal is rejected in case the monitored current is below a threshold.

Alternatively, the analog interface is not connected to a pin of the optical sub-assembly. In this case, however, monitoring of the optical sub-assembly is performed by the control interface, which requires corresponding control components. Correspondingly, external components cannot be minimized. However, through the control interface monitoring of the optical sub-assembly is flexibly configurable for various applications.

In a preferred embodiment, the optical sub-assembly is configurable through the control interface and/or through connection pads of the receiver circuit or the transmitter circuit, particularly in order to perform a bit rate adjustment, a power consumption adjustment, and/or an output signal configuration. For example, with the control interface, values of registers of the receiver circuit or the transmitter circuit may be set to appropriate values, such that an operation mode of the receiver circuit or the transmitter circuit is selected accordingly. For example, in a receiver circuit or a transmitter circuit various bit rates may be selected, such that the same optical sub-assembly may be used for various bit rates. Moreover, in a receiver circuit, output power of the communication signal may be adjusted, depending on the length of the distance between the optical sub-assembly and further components. In a transmitter circuit, signal power of the optical signal may be adjusted. Hence, power consumption of the optical sub-assembly can be flexibly optimized depending on an application. Moreover, the communication signal and/or optical signal can be configured, for example to adhere to a certain communications standard. An operation mode of an optical sub-assembly may relate to a transfer speed, an average current, a peak current, or any other operational parameter of the components. The receiver circuit or transmitter circuit may have connection pads in order to configure the analog interface and/or the control interface, wherein pads are left open or connected with or without a resistor to ground in order to configure the interfaces.

Alternatively, the analog interface and/or control interface are not configurable. In this case, however, the optical sub-assembly is less flexible usable for a wide variety of applications.

Preferably, an analog to digital converter is arranged inside the optical sub-assembly in order to convert an analog measurement of an operational parameter of the optical sub-assembly into digital data. The operational parameter may relate to a current, a voltage, a temperature, or any other operational parameter. Correspondingly, the control interface may be designed to access the digital data of the analog to digital converter and to provide a flexible interface in order to monitor various operational parameters of the electronic sub-assembly.

Alternatively, an analog to digital converter is arranged outside the optical sub-assembly. In this case, however, additional components have to be arranged when using the optical sub-assembly, e.g. when building a transceiver.

In a preferred embodiment, the analog measurement concerns a current in the light receiver respectively in the light transmitter, and/or a temperature of the light receiver respectively the light transmitter. Accordingly, operational parameters of particular importance can be monitored, which enables appropriate control of the optical sub-assembly.

Preferably, the receiver circuit respectively the transmitter circuit comprises a squelch circuit. Accordingly, only signals at a specified strength over a threshold are processed and transmitted. Outside the electronic sub-assembly, no further equipment is required in order to provide a required signal quality.

Alternatively, the transmitter circuit respectively the receiver circuit comprises digital or analog filters in order to improve the signal quality. However, particularly analog filters have to be designed according to the application, which may restrict usage of the electronic sub-assembly only to certain applications.

In a preferred embodiment, operational parameters of the receiver circuit respectively the transmitter circuit are determined by connecting corresponding pads to ground with or without a resistor, and/or by writing appropriate control data through the control interface. Accordingly, the optical sub-assembly may be configured for usage in a wide variety of applications.

Preferably, the receiver circuit respectively the transmitter circuit, the analog interface, and the control interface are arranged on a single integrated chip. Any chip technology may be used. Accordingly, the size of the optical sub-assembly may be kept small.

Alternatively, the circuits are arranged on several integrated chips. Production of the chips may then be performed by different, highly specialized production lines, which may lead to lower production costs. However, the size of the optical sub-assembly may increase.

Other advantageous embodiments and combinations of features come out from the detailed description below and the totality of the claims.

BRIEF DESCRIPTION OF THE DRAWINGS

The drawings used to explain the embodiments show.

In the figures, the same components are given the same reference symbols.

PREFERRED EMBODIMENTS

Figure 1:
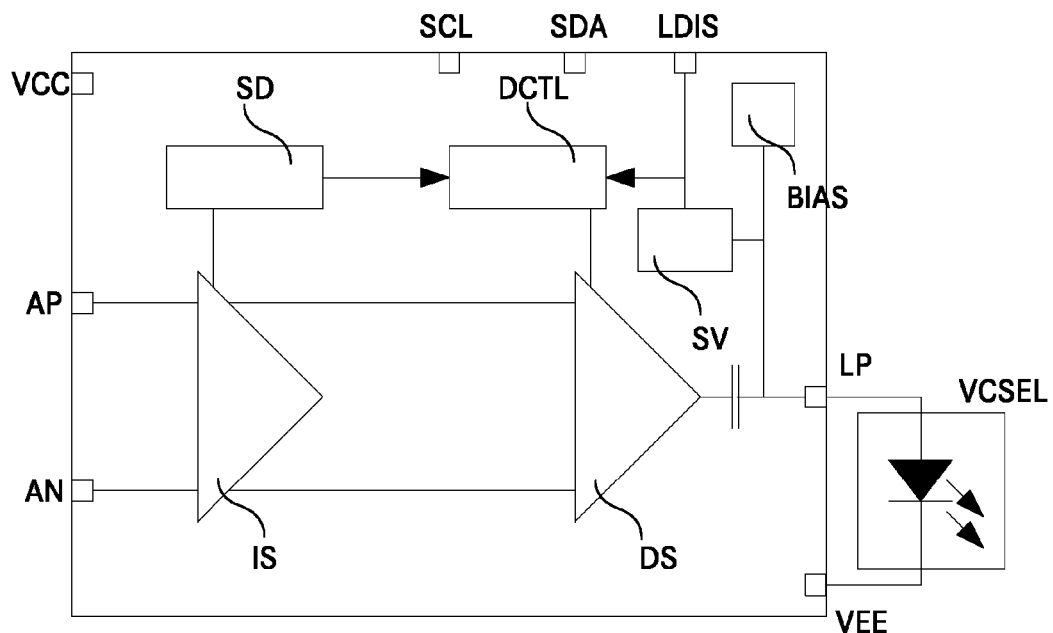
FIG. 1 a block diagram of a transmitter circuit according to the invention.

FIG. 1 shows a block diagram of a VCSEL driver (VCSEL: vertical cavity surface emitting laser), which implements a transmitter circuit according to the invention and is a key component for compact, high performance and low-power optical modules. In conjunction with the VCSEL, the chip handles the complete digital-to-optical conversion, including CML input (CML: current mode logic), laser driver, drive control and supervision.

The VCSEL driver can be used in standalone mode (no microcontroller need), or in an I2C-controlled (I2C: Inter-Integrated Circuit) mode. The I2C interface and the embedded monitoring circuits enable fully programmable OSAs (OSA: optical sub-assembly) with co-packaged VCSEL and driver, for example low-power SFP+ modules (SFP: small form-factor pluggable; SFP+: up to 10 Gbit/s) using "Smart TO-cans" implementing an optical sub-assembly according to the invention.

Both operational modes require a small number of additional components resulting in low cost, compact, high yield assemblies.

Among others, the applications comprise OC-192/STM-64 Transmission Systems (OC: optical carrier; STM: synchronous transport module), 10 GBASE-SR, 2G/4G/8G/16G Fiberchannel, USB 4.0 Active Optical Cables, SONET OC-192 with dual FEC, and avionic optical interconnects.

The VCSEL Driver features low power consumption while delivering appropriate average and modulation current; complete set of control and diagnostic features; A/D read-out of temperature; effective VCSEL current and monitor photocurrent; I2C control interface; and standalone modes for operation without microcontroller.

As shown in FIG. 1 the chip is built up of three main blocks: Input Stage IS, Output and Driver Stage DS (including biasing "VCSEL BIAS" BIAS and supervision "VCSEL Supervision" SV), and Device Control 4.

Figure 3:
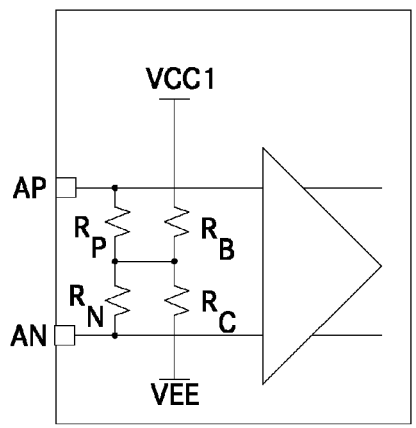
FIG. 3 equivalent circuit of the input stage of a transmitter circuit according to the invention.

The input stage IS amplifies the incoming communication signal, which is a binary data stream in the embodiment described. It provides some extended features like: Signal Detect SD, Bandwidth adjustment, Gain adjustment, and Input Mode selection. The output of the buffer is logical high when V(AP) is greater than V(AN). Two on-chip termination resistors (RP and RN), each 50Ω, define the input impedance. The input stage provides 100Ω differential input impedance. The equivalent circuit of the input stage IS is shown in FIG. 3.

The input stage IS includes a configurable polarity option via the two-wire interface to provide more flexibility in terms of physical layout options. This can potentially reduce signal integrity issues by reducing discontinuities arising from crossovers in printed circuit board layouts.

The input stage IS is also capable of adjusting the pulse width, i.e. it can increase or decrease the pulse width of the logic high level. This can be used to compensate for unequal rise and fall times of VCSELs.

The input stage IS includes a signal detect SD and squelch circuitry that can be enabled through the serial interface. When the peak-to-peak input signal is below the threshold, the output current is not modulated. The channel is not powered down. A hysteresis function is included.

The state of the signal detect SD output can be accessed through the serial interface. The Signal Detect Enable bit turns on the signal detect circuitry. In order to have the channel squelched when no input signal is present; the Squelch Enable bit has to be set. A slight increase in supply current is expected when signal detect is enabled.

The driver stage DS drives the anode of the VCSEL. Therefore, the chip is often also referred to as "p-side drive". Two different currents are required to drive the VCSEL: The bias current, which is referred to as "average current", and the modulation amplitude, which is called "modulation current".

The current driver switches the modulation current between LP and VEE. This current driving technique minimizes modulated signals on the power supply.

LP pad is connected to the VCSEL anode while adjacent VEE pad is connected to VCSEL cathode. Short and equal bond wires are preferable to improve performance by reducing capacitance and inductance in these high-speed signals.

Figure 2:
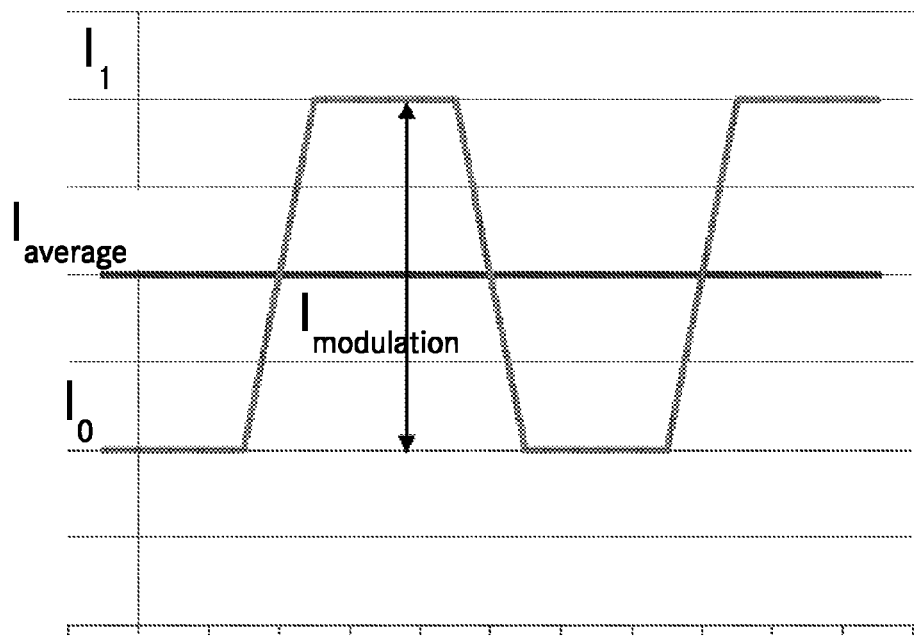
FIG. 2 modulation current and average current in an optical sub-assembly according to the invention.

FIG. 2 illustrates the modulation current and the average current. The modulated signal toggles around the average current. The amplitude of the toggling signal is the modulation current.

The VCSEL driver provides two mechanisms to drive higher loads at the output: Drive Tuning and Peaking. The drive tune increases the biasing of the driving stage and makes it faster. The peaking pre-compensates the expected losses at the output by changing the shape of the signal.

The device control DCTL according to FIG. 1 controls and supervises all the device functions. The chip can be operated in two basic modes: in I2C-controlled mode, wherein the chip is fully controlled through an I2C interface by an external Microcontroller, and in standalone mode, wherein the average current and modulation current are controlled by two external resistors, whereby no setting can be made via I2C, no external Microcontroller is required, and monitoring functions through I2C are accessible.

The device control DCTL also includes an ADC (ADC: analog-to-digital converter), which converts the monitor currents into digital values, which can be accessed via I2C interface.

The pad descriptions of the VCSEL driver are as follows:

Power and Ground Signals

| Pin Name | Type | Description |
|---|---|---|
| VCC | Supply | Positive supply. It is sufficient to connect just one pad. However, it is possible to connect multiples. |
| VEE | Supply | Negative supply, substrate. It is sufficient to connect just one pad. However, it is possible to connect multiples. |

Data Path Signals

| Pin Name | Type | Description |
|---|---|---|
| AP, AN | Differential Data In | Differential high-speed Data Input pad P is the positive (non-inverted) node and N is the negative (inverted) node. The differential inputs are internally terminated with 100 Ω (2 × 50 Ω). Do not use pull-up/pull-down resistors on these high-speed differential inputs. |
| LP | Analog Output | Driver output connected to VCSEL anode. The output delivers both average and modulation currents. |

Management Interface Signals

| Pin Name | Type | Description |
|---|---|---|
| SDA | CMOS Input, Pull-up/open drain output | The Serial Data pad (SDA) is a bidirectional pad for the data signal. The pad can be tied directly to VDD of 3.3 V. The SDA pad is I2C-bus compatible. This pad is a CMOS input/output pad. |
| SCL | CMOS Input, Pull-up | The Serial Clock pad (SCL) is the clock signal of the serial interface. The pad can be tied to VDD 3.3 V. The SCL input is I2C-bus compatible and can be clocked at up to 1000 kHz. |

Configuration and Status Signals (for Smart OSA, all these control and status signals are left unconnected.)

| Pin Name | Type | Description |
|---|---|---|
| NOTINT | CMOS Open Drain Output, Pull-Up | The active-low Interrupt (NOTINT) signal notifies the external microcontroller about driver events. These events include VCSEL operating voltage violations (VVL, VVH), input loss of signal, input signal detect and control loop faults. The polarity of the interrupt can be inverted by programming. The state of the pad may be read through the management interface. |
| IMON | Analog Output | The Monitor Current output (IMON) is an analog output with two functions. The IMON Select Register controls a multiplexer to select either a scaled replica of the unit current, a temperature proportional current, the photocurrent of the feedback PD, or, a scaled copy of the average current in the VCSEL. By measuring the unit current during production, process dependencies are isolated and an estimate of the settings can be calculated. The average current and modulation current are derived from the unit current (IU). The IMON current is used for real time diagnostic functions. The output is connected to ground via a resistor. A microcontroller with an integrated analog to digital converter can monitor this output and service queries from the host system. |

| Pin Name | Type | Description |
| --- | --- | --- |
| PD | Analog Input | The Photo-Detector current monitor input is an analog input used to implement an Automatic Power Control (APC) loop. The cathode of the Photo detector is connected to the PD input, and the anode is connected to VEE. |
| LDIS | CMOS Input, Pull-Down | The Laser Disable pin (LDIS) is a global output disable signal that will set IAVG and IMOD to 0 when it is high, regardless of other settings.<br>The pad can be left unconnected and the device will operate normally. The state of the pad may be read through the management interface. |
| C1,2 | CMOS Input, Pull-Up | Configuration selection: if both inputs are high, resp. unconnected, then the chip will be in the I2C-controlled mode. Otherwise, it will be in one of the standalone modes. |
| RAVG | Analog I/O | If in standalone mode, the resistor attached between this pad and ground determines the average current. |
| RMOD | Analog I/O | If in standalone mode, the resistor attached between this pad and ground determines the modulation current. |

All pads have ESD (ESD: electrostatic discharge) protection other than LP.

Figure 4:
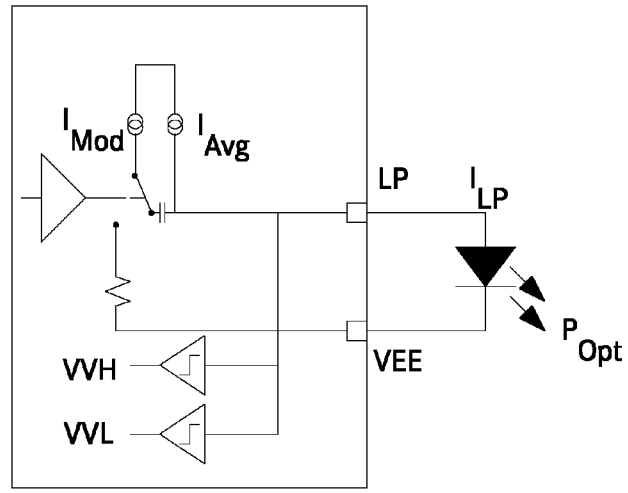
FIG. 4 equivalent circuit of the output stage of a transmitter circuit according to the invention.

FIG. 4 shows the equivalent circuit of VCSEL driver output stage. In the logical High (True) state, the laser is on and the current is defined by:

$$I_{LP;High} = I_{Avg} + \frac{I_{Mod}}{2}$$

In the logical Low (False) state, the laser is off and the current is defined by:

$$I_{LP;Low} = I_{Avg} - \frac{I_{Mod}}{2}$$

The BM bits control the modulation current. The BA bits control the average current. The PK bits control peaking current. The PD bits control the duration of the peaking pulse.

Figure 5:
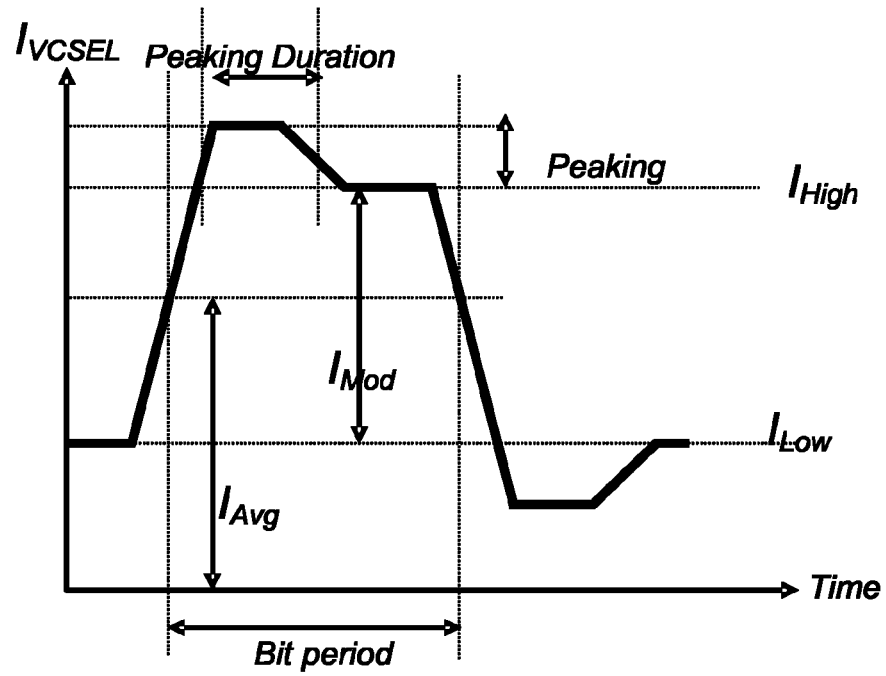
FIG. 5 peaking in a transmitter circuit according to the invention.

Conceptually, the current delivered to a resistive load is shown in FIG. 5. The amount of peaking is expressed as a percentage of the $I_{mod}$ and can be up to 55% of the $I_{mod}$. The duration of the pulse is between 30 ps and 55 ps, for example.

In order to provide laser disable, the current sources are shut off under a number of conditions: when the LDIS pin is high, IMOD and IAVG are set to 0 mA; when the AUTOLDIS function is enabled, a VCSEL voltage high event will also disable a channel by setting IMOD and IAVG to 0 mA; when the ULDIS function is enabled, an I2C command will also disable a channel by setting IMOD and IAVG to 0 mA.

These signals switch off the current sources in the driver to provide an emergency shutoff mechanism in order to comply with eye safety standards. Note that power-down is not equivalent to laser disable.

Figure 6:
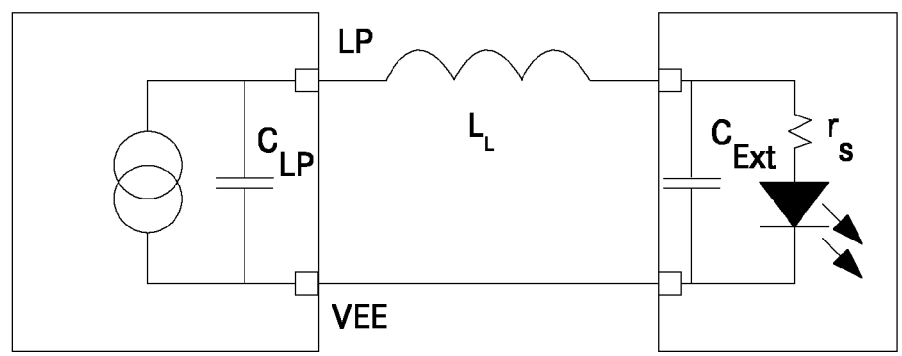
FIG. 6 equivalent circuit of the driver stage of a transmitter circuit according to the invention.

FIG. 6 shows the equivalent circuit model of the driver stage. The driver stage output is modeled by a current source and a capacitance CLP. The VCSEL and its assembly are modeled by a wiring inductance LL, a series resistance rS, and an extrinsic capacitance CExt.

The VCSEL driver has multiple modes of drive control that are selected by the Cx pads. The I2C-controlled mode allows average and modulation current settings, as well as other controlling functions, via the serial interface. The BurnIn mode is a sub-mode of the I2C-controlled mode, enabled through the serial interface. The output is not modulated. The Standalone Modes are enabled if one or both Cx pins are pulled low. The average and modulation currents are set according to resistors attached at pins RAVG and RMOD, or kept at pre-set values. The settings through the serial interface are ignored, but the serial interface can still be used to read out status information.

| C2 | C1 | Mode |
| --- | --- | --- |
| 0 | 0 | SA 1 |
| 0 | 1 | SA 2 |
| 1 | 0 | SA 3 |
| 1 | 1 | I2C-controlled mode |

Drive Current Setting in I2C-controlled mode is as follows. The internal unit current $I_U$ is generated with an on-chip reference circuit. The serial interface allows each of the average current and modulation voltage of the 4 channels to be set individually. The following equations show the weighting of the different bits on the total current. A 6-bit linear DAC converts the register setting into VCSEL average current and modulation current as shown below:

$$I_{Avg} = N_{avg} \cdot I_{U,SCALE} \cdot \frac{(32 \cdot BA32 + 16 \cdot BA16 + 8 \cdot BA8 + 4 \cdot BA4 + 2 \cdot BA2 + BA1)}{48}$$

$$I_{Mod} = N_{Mod} \cdot I_{U,SCALE} \cdot \frac{(32 \cdot BM32 + 16 \cdot BM16 + 8 \cdot BM8 + 4 \cdot BM4 + 2 \cdot BM2 + BM1)}{48}$$

The average current has a multiplication factor of $N_{Avg}$ and the modulation current of $N_{Mod}$.

The Drive Current Scale and Burnin Mode are as follows. The drive current scale is a means to increase the resolution of one bit of $I_{Avg}$ and $I_{Mod}$. This is useful if not the full current is required (The Maximum current is defined as the current at digital value BA/BM=48 (0x30). In the analog mode the maximum current is defined at $R_{AVG}$, $R_{MOD}$=2.4Ω, for example). For the calculations of the resulting currents, following table should be considered (as an example, max current values are indicated):

| CURSCALE1 | CURSCALE0 | Description |
|---|---|---|
| 0 | 0 | Power saving mode, max current 5 mA |
| 0 | 1 | Enhanced mode, max current 7.5 mA |
| 1 | 0 | Default mode, max current 10 mA |
| 1 | 1 | Burnin mode, max current 15 mA |

The Burn-In Mode is designed to provide a higher average current into the VCSEL. The inputs must be un-modulated and a supply voltage of 3.3 V or greater is preferable. This mode delivers more current to the output than in normal mode with maximum settings of the BA bits. The amount of burn-in current is programmable and uses a scaling factor to supply the higher average current. The programmable component is programmed using the Channel Average Current Registers (BA bits) and the Current Scale settings of the Device Control Register III (CURSCALE bits).

The Drive Current Setting in the Standalone Modes is as follows. In the standalone modes, the drive currents are defined by a voltage $V_{TC}$ or $V_{BG}$, divided by a resistor $R_{Avg}$ resp. $R_{Mod}$. If no resistor is attached, then a pre-set current is used for each value/mode. $V_{TC}$ is equal to $V_{BG}$ at room temperature (RT, 300 K), and moves up and down in proportion to the absolute (Kelvin) temperature (as an example, current values are indicated):

| | IAvg | | IMod | | |
|---|---|---|---|---|---|
| Mode | RAvg attached | RAvg left open | RMod attached | RMod left open | Other settings |
| SA 1 | 20* VTC/ | 6.5 mA RAvg | 20* VTC/ | 6.5 mA RMod | High speed, peaking on |
| SA 2 | 20* VTC/ | 5.5 mA RAvg | 20* VTC/ | 5.5 mA RMod | Balanced power/speed |
| SA 3 | 20* VBG/ | 4 mA RAvg | 20* VBG/ | 4 mA RMod | Low power, peaking off |

The serial interface can be used in the standalone modes, with the following effect: All registers can be read; Writing to registers has no effect; the bit settings are forced as follows: NOTINT with regular polarity, with only VVH alert unmasked, and ITHERM on the IMON output The VCSEL Voltage Supervision is as follows. The VCSEL voltage supervisor of each channel compares the average voltage at the driver output with two programmable thresholds and generates the appropriate status signals. When the average voltage is above VVTH, a VVH event is declared. When the average voltage is below VVTL, a VVL event is declared. These events cause the NOTINT pin to be asserted if the events are not masked. If AUTOLDIS is enabled, a VVH event causes the output to be disabled. VVTH and VVTL are programmable to accommodate different VCSEL types and process variations of the VCSEL driver.

Figure 7:
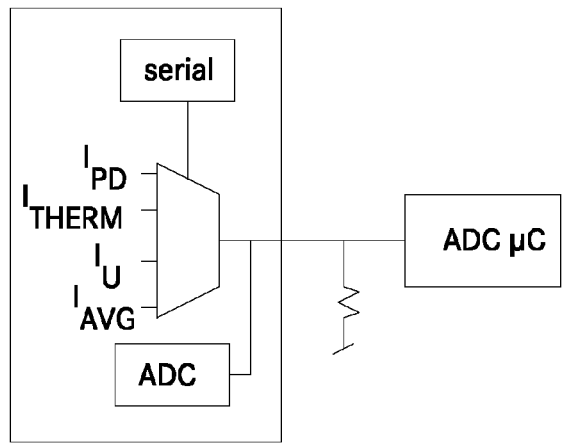
FIG. 7 analog values made available by an analog to digital converter (ADC) for control, monitoring and diagnostics.

A number of analog values are made available for control and diagnostics, as a current on the IMON pad and through the on-chip ADC (cf. FIG. 7). On-chip ADC: used for Smart TO-can; the results are read out through I2C, no separate wiring is required. IMON pad: typically shunted using an external resistor, and connected to an ADC input of the controller.

The temperature sensor produces a current ($I_{therm}$) at the IMON pin. It is proportional to the temperature. Two characteristics define the operation of the circuit: The absolute value of $I_{therm}$ at 50° C.; and the slope of the thermal current $$\left(\frac{\Delta I}{\Delta T}\right).$$

These constants are specified as typical values. Note that these values are not guaranteed by measurements at test and this implies that calibration is required. The absolute value of $I_{them}$ varies significantly across process while the slope $$\frac{\Delta I}{\Delta T}$$

is relatively constant. Calibration is performed by measuring $I_{therm}$, with the driver turned off with a known case temperature (and junction temperature). With the device turned on, the amount of power being supplied to the chip and the case temperature of the module is measured. These two points provide sufficient information to calculate the thermal conductivity and can be used to extrapolate all other temperatures accurately.

The scaled copy of the average current being driven into a specific VCSEL is added to the IMON output when the AVGSEL bit is set and the other bits of the IMON Select Register are cleared. The output is defined as:

$$I_{MON} = \frac{I_{Avg}}{66}$$

The Internal Unit current is added to the IMON output when the IUSEL bit is set and the other bits of the IMON Select Register are cleared and is defined as:

$$I_{MON} = \frac{I_U}{4}$$

$I_U$ provides an accurate process independent estimate of the average current and modulation voltage. By measuring this current during production, an estimate of the desired settings can be calculated.

The PD feedback current is added to the IMON output when the FBPDxxSEL bit is set and the other bits of the IMON Select Register are cleared. FBPD11SEL provides a 1:1 copy of the VCSEL feedback PD. FBPD13SEL multiplies the current in order to get a 1:3 copy of the VCSEL feedback PD.

Interrupt Generation is as follows. The NOTINT output is an open-drain output. The open-drain output allows multiple interrupts to be wired-OR together for systems with a limited number of interrupt inputs. The polarity of the output may be inverted using the INTINV bit. Each interrupt source may be masked. Many sources are available both as positive and complementary quantities. For example, Signal Detect is equivalent to the complement of Loss of Signal. Many events are available as latched and unlatched quantities. A latched quantity retains the values even when a transient event occurs. The interrupt can be decoded efficiently in various ways to improve real-time response. Depending on the type of interrupt, the host system can be immediately notified. The VCSEL driver can report the following events at the NOTINT output:

| Event Type | Description |
| --- | --- |
| SD | Input signal detected |
| LSD | Transition to signal detect |
| LOS | Loss of signal of input |
| LLOS | Transition to loss of signal |
| VVH | VLP > VVH_level |
| LVVH | Transition to $V_{LP}$ > VVH_level |
| VVL | VLP < VVL_level |
| LVVL | Transition to VLP < VVL_level |

For the VCSEL driver and the dual-band limiting TIA described below, the serial interface consists of a two-wire interface, SDA and SCL, which is the data and clock signal respectively. This interface is I2C-bus compatible. The implementation is identical in protocol processing but deviates from the standard in the IO implementation. The IO pad includes an internal 10Ω pull up resistor. This is an optimization of the design for the typical application where there is only one master and one slave device on a short bus with relatively little capacitance. Another deviation from the standard in the IO pad is the performance of glitch suppression. The capability to suppress glitches is less than the standard specifies. Finally, the IO buffers are optimized for operations at up to 1 MHz to enable applications that use bit banging to implement the interface and maximize performance. Particularly the "Fast Mode" and "Fast Mode Plus" I2C features are supported.

Figure 8:
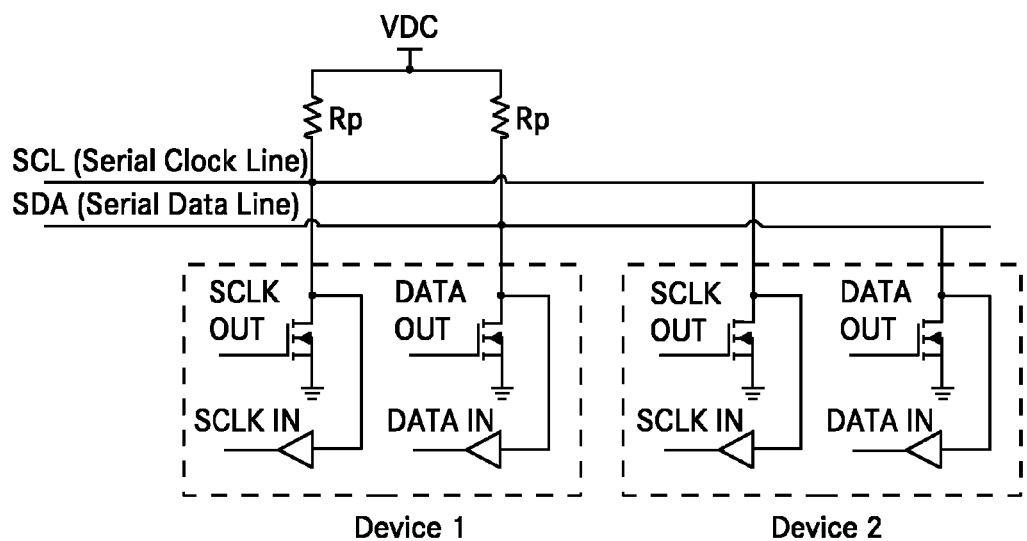
FIG. 8 devices on an I2C bus according to a typical application.

Each device on the bus must have a unique address. In typical applications (cf. FIG. 8) the microcontroller will be the master of this bus and the VCSEL driver/dual-band limiting TIA and a number of devices such as EPROM will be slaves. The VCSEL driver/dual-band limiting TIA is not a master device. Each device on the bus must have a unique address. Since this serial bus is intended for driving very short traces like those inside a module, the maximum load of the bus must be sufficiently low to meet the rise and fall times requirements. $V_{PP}$ supported include 3.3 V and 2.5 V. Buffers are bidirectional buffers that have open-drain output and a high-impedance input buffer. The device does not respond to general call address request at address 7b'0000000. The I2C-bus should be connected as shown in FIG. 8. (A 10 kΩ pull-up resistor Rp may be included on chip and calculations to determine the resistance may include this resistor.)

The internal address space and memory map allows management functions including: Average currents, modulation currents, peaking control for the channel; Identification of the device; Selection of the analog control/diagnostic value that is being monitored; ADC Read out of the analog control/diagnostic value; Configuration of the operation mode of the channel; Configuration of the interrupt generation logic; Configuration of the monitored thresholds.

Figure 9:
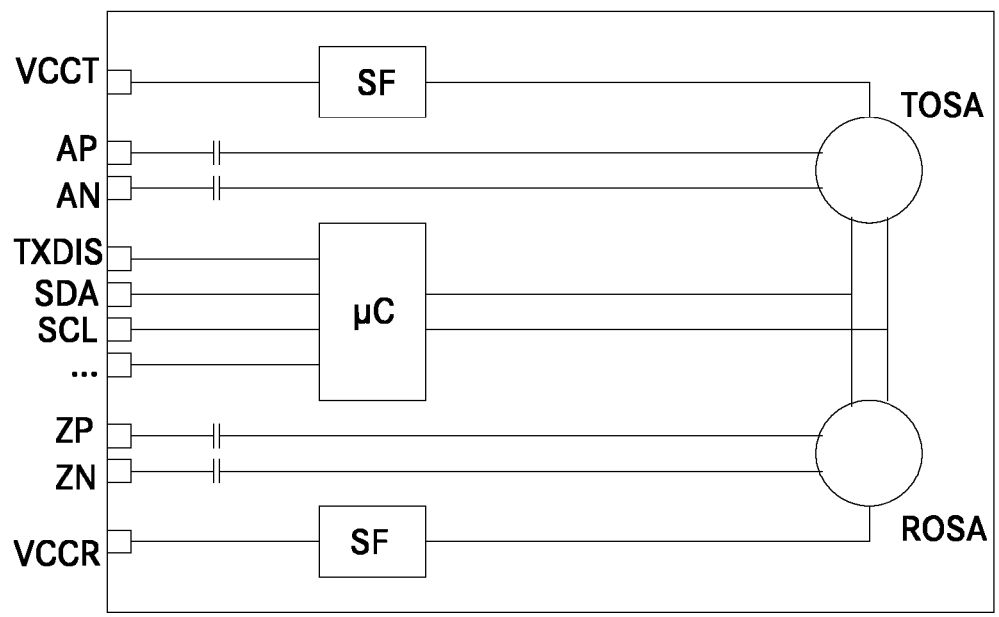
FIG. 9 block diagram of a transceiver comprising optical sub-assemblies according to the invention.

FIG. 9 shows an application example. A TX TO-can comprising a VCSEL and a VCSEL driver as described above and a RX TO-can comprising a PD (PD: photodiode) and a dual-band limiting TIA as described below are arranged on a PCB (PCB: printed circuit board). The I2C manageable TO-cans allow to achieve integration into the TO-can of all high speed electronics to simplify design and improve performance. These smart TO-cans can then be integrated into the SFP+ modules in a classic way. The PCB contains just dumb RF tracks, plus low frequency components. This is a cost efficient architecture with no significant cost penalty as compared to SFP+ in volume expected. The smart TO-cans provide flexibility for applications other than SFP+VSR (VSR: very short reach). The supply voltages are connected to the TO-cans via supply filters SF, which are standard low-cost components. A microcontroller μC is arranged on the PCB to complete the electrical circuits. RF 50Ω tracks run from the module periphery directly to the TO-cans via AC-coupling capacitors. Peripheral I2C interface and other control signals are connected to the microcontroller μC. An internal I2C bus connects the microcontroller to the two TO-cans. The microcontroller is the master of this internal bus, it sets the control registers and polls the status registers of the TX TO-can and the RX TO-can.

Figure 10:
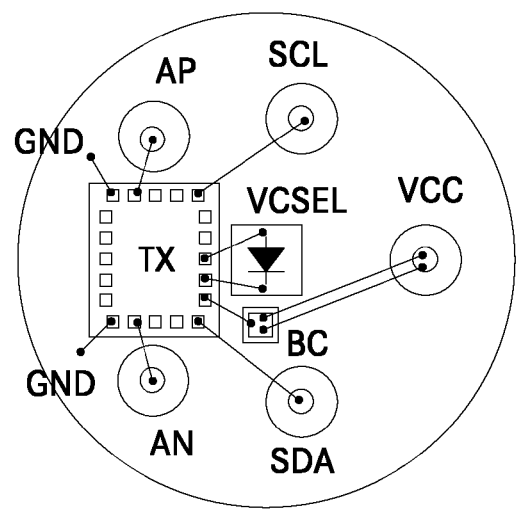
FIG. 10 TO-can arranged as transmitting optical sub-assembly (TOSA)

FIG. 10 shows the bonding diagram for the Smart TO-can with a VCSEL and a VCSEL driver. Only a minimum of connections are required. The VCSEL driver is connected to the TO-can, which forms ground GND. The AP/AN pads of the VCSEL driver are connected to the respective AP/AN pins of the TO-can with short wires. The SCL/SDA pads of the VCSEL driver are connected to the respective pins of the TO-can. A supply via bypass capacitor BC is provided to opposite side. The VCSEL anode is connected to the LP pad of the VCSEL driver. The VCSEL cathode can be connected to on-chip ground pad, where both orientations are supported, or via VCSEL backside to TO-can.

Figure 11:
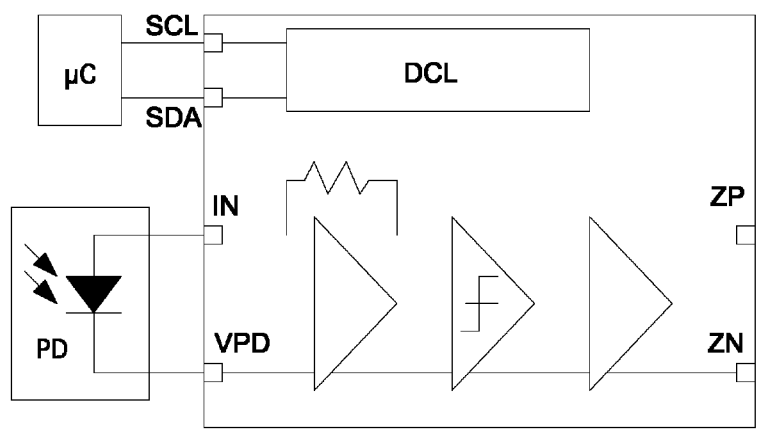
FIG. 11 a block diagram of a receiver circuit according to the invention.

FIG. 11 shows a block diagram of a low power and high performance dual-band limiting TIA (TIA: transimpedance amplifier), which implements a receiver circuit according to the invention. The dual-band limiting TIA implements all the functionalities that are traditionally shared between a TIA and a separate LIA chip (LIA: limiting input amplifier).

The dual-band limiting TIA can be used in stand-alone mode (no microcontroller need), or in an I2C-controlled mode. The I2C interface and the embedded monitoring circuits enable fully programmable OSAs with co-packaged PD (PD: photodiode) and receiver, for various applications such as low-power SFP+ modules using "Smart TO-cans" according to the invention. Both operational modes require a small number of additional components resulting in low cost, compact, high yield assemblies.

The applications are the same as for the VCSEL driver described above. The dual-band limiting TIA features high input sensitivity; low typ. power consumption in high performance mode; large gain; bandwidth selection enabling data rates, for example from 2 Gb/s to 14 Gb/s; LIA/AGC for large dynamic range; line driver with output swing selection; A/D read-out of temperature, RSSI information; adjustable pre-emphasis circuit; squelch circuit; I2C control interface; stand-alone mode for an operation without microcontroller.

In order to achieve the best possible performance at the various bit rates, the dual-band limiting TIA implements two externally selectable operation bands. The low operation band covers data rates, for example from 1 to 5 Gb/s (narrow band mode). The high operation band allows data rates from for example 5 to 14 Gb/s (wide band mode). If the dual-band limiting TIA is configured to run in dual-band operation, the RSSI pad (RSSI: received signal strength information) is simultaneously used to provide the received signal strength information and to switch between the two operation bands. This mechanism allows the packaging of the dual-band limiting TIA in widely used 5-pin base ROSAs (ROSA: receiver optical sub-assembly) to obtain a cost-effective high volume product covering a large range of applications.

The dual-band limiting TIA provides I2C interface and embedded monitoring circuits enable fully programmable OSAs with co-packaged PD and receiver, for various applications such as low-power SFP+ modules using smart TO-CANs. An on-chip A/D conversion circuit enables a digital read-out of analog monitoring information such as RSSI and temperature. The presents of an on-chip A/D conversion circuit eliminates the need of addition analog output pin at the ROSA level allowing very compact but highly flexible ROSA designs (e.g. based on 6-pin TO-cans used in APD applications, APD: avalanche photodiode) providing the complete feature set traditionally shared between TIA and separate LIA chips.

The dual-band limiting TIA has two basic operating modes controlled by the legacy pin. First, an I2C-controlled mode for applications with use of external micro-controller. In this mode, the chip settings are controlled via an I2C interface. Second, a stand-alone mode for applications without use of external micro-controller. In this mode, the chip is controlled via a configuration interface described below.

In the I2C-controlled mode, the user has access to many monitoring and configuration features: Digital read-out of RSSI/temperature information (using on chip A/D conversion); Dual Band operation; Manual decision threshold control (bit slicer); Adjustable bandwidth for each of the two operation band; Performance/power optimizations for the different target applications; Output swing adjust feature; Automatic gain control with max gain adjustment for extremely very large dynamic range; Pre-emphasis circuit; On-chip temperature measurement; Channel polarity inversion; and Automatic Gain Control/Signal Detect threshold adjustment.

In the stand-alone mode, the dual-band limiting TIA is configurable via the 4 following configuration pads and the RSSI: notInverted pad to control the channel polarity; notSquelch pad to control the squelch circuitry; notHFRSSI pad to control the cut-off frequency of the RSSI circuit; and notDualBW pad to control the dual band operation mode of the chip; RSSI pad, which allows measuring the Received Signal Strength and, simultaneously, the switching switch from one band to the other.

The pad descriptions of the dual-band limiting TIA is as follows:

Data Path Signals

| Pin Name | Type | Description |
| --- | --- | --- |
| IN | Analog Input | The Photodetector input (IN) pin is an analog input that is connected to the anode (p-side) of the photo detector. The cathode of the detector must be connected to the VPD pad. |
| VPD | Supply | The Photodiode Voltage pin provides the photodiode cathode bias voltage. |
| ZP, ZN | Differential Data output | The Data Output pins are the differential high-speed outputs, where P is the positive (non-inverted) node and N is the negative (inverted) node. |

Management Interface Signals

| Pin Name | Type | Description |
| --- | --- | --- |
| RSSI | Analog Output/ Control Input | The Receiver Signal Strength Indicator (RSSI) pin is an analog output that sources a current proportional to the average photo-detector current. The output is used during manufacturing for active alignment. In the Stand-alone mode, the RSSI pad is also used when the device is configured to operate in the dual bandwidth selection mode when the device is configured to operate in the dual bandwidth selection mode. In this mode, the chip will sense the voltage at the RSSI pin and if the sensed voltage is above the narrow bandwidth selection threshold Vn, the device will enter the narrow band mode. If the sensed voltage is below the wide bandwidth selection threshold, then the device will enter the wide band mode. |
| notInt/SD | CMOS Open Drain Output | In the I2C-controlled mode, the NOTINT pin notifies an external microcontroller about events such as signal detect, loss of signal, and, RSSI voltage alert in case the corresponding mask bit is unchecked. The polarity of the interrupt can be inverted by programming In systems using polling-based firmware, this input may be left unconnected. In the Stand-alone mode, this pin indicates Signal Detect (SD) events only. |
| TestD | CMOS Input, Pull-Down | Test input. Do not use. |
| SCL | CMOS Input/Open Drain Output, Pull-Up | The Serial Clock pin (SCL) is the clock input signal of the serial interface. The pad can be tied to VDD of 3.3 V or 2.5 V via a resistor. The SCL input is I2C-bus compatible and operates at up to 1000 kHz. If the serial interface is unused, this pad is unconnected. |
| SDA | CMOS Input/Open Drain Output, Pull-Up | The Serial Data pin (SDA) is a bidirectional pad for the serial data signal. The pad can be tied to VDD of 3.3 V or 2.5 V via a resistor. The SDA pad is I2C-bus compatible and operates at up to 1000 kHz. If the serial interface is unused, this pad should be left unconnected. |
| LEGACY | CMOS Input, Pull-Up | If the Legacy pin is high, the Stand-alone mode is enabled; if it is low, the I2C-controlled mode is enabled. |
| notInverted | CMOS Input, Pull-Up | If the notInverted pin high, the channel is inverted; if it is low the channel has a normal polarity. |
| notSquelch | CMOS Input, Pull-Up | If the notSquelch pin low, the channel squelches when the peak-to-peak input current is below the squelch threshold. If it is high, the channel does not squelch. |

| Pin Name | Type | Description |
|---|---|---|
| notHFRSS 1 | CMOS Input, Pull-Up | If the notHFRSSI pin low, the bandwidth of the RSSI will be more than 100 kHz; if it is high, the RSSI bandwidth will be tied to the lower cut-off frequency. |
| notDualBW | CMOS Input, Pull-Up | If the notDualBW pin low, the chip will sense the voltage at the RSSI pin. If the sensed voltage is above the bandwidth selection threshold, the chip will enter the low bandwidth mode. If the dualBW pin is low, the chip will stay in the large bandwidth mode independent of the voltage at the RSSI pin. |

When operated in stand-alone mode, the dual-band limiting TIA comprises and provides a transimpedance amplifier with automatic threshold control (cut-off frequency less than 50 kHz); automatic gain control to allow a very large dynamic range (currents up to 3 mApp); dual band operation; signal detection with squelch function; monitor current RSSI; and channel polarity inversion RSSI high cut-off frequency >100 k.

The I2C interface gives access to the following features additionally: A/D conversion to allow a digital readout of the RSSI/die temperature; a pre-emphasis circuit; adjustable output swing; adjustable decision circuit threshold (bit slicing circuit); temperature Sensor; adjustable RF bandwidth and gain for an application specific performance/power optimization; and RSSI voltage alert.

The photodiode p (anode) and n (cathode) are bonded directly to IN and on-chip VPD respectively. The capacitance of the photo detector must be matched with an internal capacitor to achieve the best performance.

Figure 12:
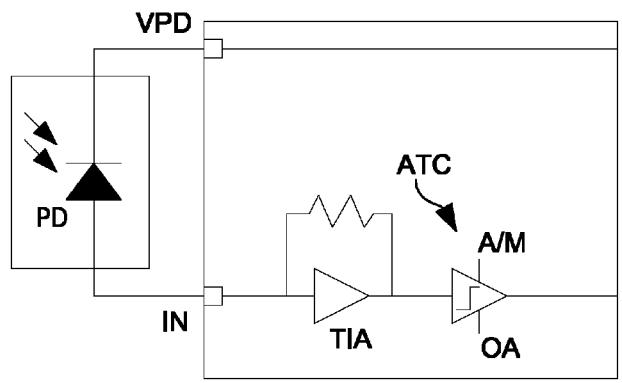
FIG. 12 equivalent circuit diagram of a transimpedance stage with automatic/manual threshold circuit.

FIG. 12 show the equivalent circuit diagram of the transimpedance stage with automatic/manual threshold circuit. This stage is composed of a transimpedance amplifier stage followed by a decision circuit. The threshold of the decision circuit can be automatically or manually A/M set (bit slicing). The TIA stage amplifies linearly the current coming from the photodiode. The TIA bandwidth has a direct impact on the BER performances (BER: bit error rate) and the chip power consumption. It is adjustable in the I2C-controlled mode via the TIABW bits. The automatic decision threshold circuit ATC uses a low frequency feedback loop to remove the DC component of the input signal. This DC cancellation centers the signal within the amplifier's dynamic range and reduces pulse-width distortion. In order to optimize the bit error rate performance, the dual-band limiting TIA features also offset adjustment OA of the decision threshold (bit slicer). This functionality is mainly used when the optical input has unequal amount of noise on the '0' and '1' levels. Assuming a PD responsivity of for example 0.9 A/W, the decision threshold can be moved up/down linearly, for example in 128 steps within the range [−100 µWpp-100 µWpp]. The bit slicer circuit is only available in the I2C-controlled mode and is set with the following bits: the bit SIGNUM controls whether the threshold is moved up or down; and the bits OFFx control the offset of the decision threshold.

The dual-band limiting TIA features two monitor currents: the RSSI current is equal to the average input current; and the $I_{Therm}$ current is proportional to the die temperature.

These two currents can be read out on the physical RSSI pin and via the I2C interface. The switching mechanism RSSI/$I_{Therm}$ is controlled by the IThermRSSI bit as explained below.

The DC/low-frequency output RSSI is used as an input monitor current. The RSSI current is equal to the average input photocurrent with for example ±5% accuracy, small offset (e.g. below 2 µA) for DC currents up to for example 2 mA as long as $V_{RSSI}$ is within the operating range specified. The RSSI output enables the manufacturer to actively align the ferrule during the manufacturing process. Active alignment of the ferrule simply involves maximizing the current at the RSSI output while optimizing the alignment. In the stand-alone mode, RSSI is accessible on the physical pin only. In the I2C-controlled mode, RSSI is accessible on the physical RSSI pin and via the I2C interface when the IthermRSSI bit is set to '0'.

The dual-band limiting TIA features a temperature sensor which provides a current linearly proportional to the die temperature $I_{therm}$. This current is characterized by: absolute value at 50° C.: $I_{50°\,C.}=106$ µA; and slope $$\frac{\Delta I}{\Delta T} = 1\ \mu A.°\ C.^{-1}$$

The slope $$\frac{\Delta I}{\Delta T}$$

is constant over process but the absolute value varies significantly and needs to be calibrated. The calibration is done by measuring the current $I_{therm}$ at 50° C. ($I_{therm\ 50°\,C.}$). The temperature as a function of the $I_{therm}$ current is then given by the following formula:

Temperature(° C.)=$I_{therm}$(µA)−($I_{therm\ 50°\,C.}$(µA)−50)

In the stand-alone mode, the $I_{therm}$ current is accessible via the I2C interface. In the I2C-controlled mode, it is accessible on the physical RSSI pin and via the I2C interface when the IthermRSSI bit is set to '1'.

The dual-band limiting TIA covers a large operation range with a single ROSA design. In order to achieve the best possible performance at the various bit rates, the dual-band limiting TIA implements two externally selectable operation bands. The narrow band mode band covers data rates from for example 1 to 5 Gb/s (narrow band mode). The wide band mode allows data rates from for example 5 to 14 Gb/s (wide band mode). If the dual-band limiting TIA is configured to run in dual-band operation, the RSSI pin is simultaneously used to provide the received signal strength information and to switch between the two operation bands. This mechanism allows the packaging of the dual-band limiting TIA in widely use 5-pin base ROSAs to obtain a cost-effective high volume product covering a large range of applications.

In stand-alone mode, due to the limited number of pins in TO-CAN packages, the RSSI monitor output pin is used for the bandwidth selection. When the dual-band limiting TIA operates in the dual band mode ('notdualBW' pin tied to ground), the bandwidth selection circuit will sense the voltage at the RSSI output. If the sensed voltage is in the specified range $V_n$, the dual-band limiting TIA operates with the narrow band mode optimized for bitrates of for example 1 to 4 Gb/s. If the sensed voltage is in the specified range $V_w$, the dual-band limiting TIA operates with the wide band mode optimized for bitrates of for example 5 to 14 Gb/s. In order to switch the bandwidth, the user simply sets VRSSI to the lower limit of the corresponding voltage range Vn and Vw. The shunt resistor that is used to read out the RSSI current must be chosen such that the maximum RSSI current multiplied by the value of the read-out shunt resistor does not exceed the upper limits of Vw and Vn: otherwise, a large optical input power could trigger an accident switch of bandwidth. The following truth table summarizes the switching mechanism in the stand-alone mode (voltages and frequency bands are given as examples):

| notDualBW pin | Voltage on RSSI pin | Mode |
| --- | --- | --- |
| Ground | [0 V-1.1 V] | Wide band mode (5 to 14 Gb/s) |
|  | [1.3 V-2.4 V] | Narrow band mode (1 to 4 Gb/s) |
| VCC or Open | 0 V-2.4 V | Wide band mode (5 to 14 Gb/s) |

Leaving the 'notdualBW' pad open prohibits the dual band mode. The chip operates in the wide band mode independent of the voltage at the RSSI pad. Prohibiting dual band operation allows for larger RSSI read out shunts in case only the large bandwidth operation is used.

In the I2C-controlled mode, the narrow band/wide band switching mechanism is controlled with the two bits DualBW and Mode4G: the chip operates in the narrow band mode when the Mode4G bit is set to '1', independently of the DualBW bit value; and the chip operation depends on the DualBW bit value when the 4GMode bit is set to '0'. When DualBW is '0', the chip is forced in the wide band mode. When '1', the bandwidth selection circuit will sense the voltage at the RSSI output. If the sensed voltage is in the specified range Vn (defined in section Electrical Characteristics) the dual-band limiting TIA operates in the narrow band mode optimized for bitrates of e.g. 1-4 Gb/s. If the sensed voltage is in the specified range Vw (defined in section Electrical Characteristics), the dual-band limiting TIA operates in the wide band mode optimized for bitrates of e.g. 5-14 Gb/s. The following truth table summarizes the switching mechanism in the I2C-controlled mode (frequency bands are given as examples).

| DualBW bit | 4GMode bit | Mode |
| --- | --- | --- |
| 0 | 0 | Wide band mode (5 to 14 Gb/s) |
| 0 | 1 | Narrow band mode (1 to 4 Gb/s) |
| 1 | 0 | Depends on Vrssi |
| 1 | 1 | Narrow band mode (1 to 4 Gb/s) |

The signal-detect circuitry compares the channel input signal amplitude with the squelch turn-on threshold. If it is above this threshold, the signal detect condition is asserted. A hysteresis function of greater than 2 dB prevents chattering of the signal detect signal. The state of the signal detect is accessible directly via the notInt/SD pin or via the two-wire interface.

In the I2C-controlled mode (Legacy pad tied to GND), the signal detect threshold is adjustable within a specified range through the SDTH bits.

In the stand-alone mode (legacy pad left open or tied to VCC), the signal detection can be disabled by setting the SDRectEn bit to '0'. This will reduce the current consumption.

Figure 13:
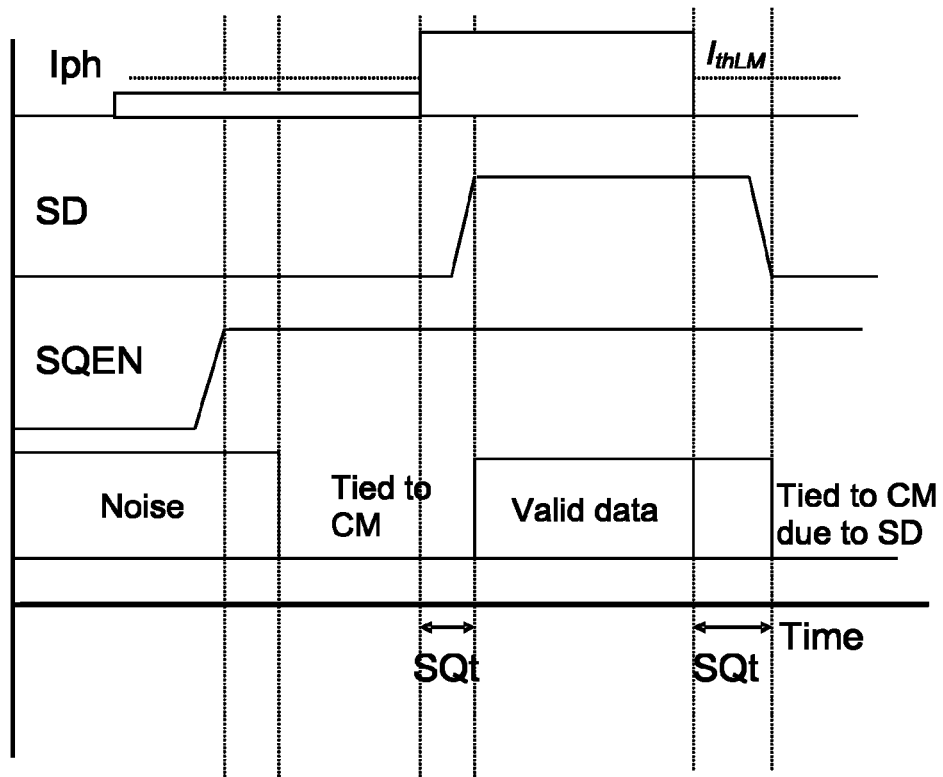
FIG. 13 the response time of a squelch circuit.

The dual-band limiting TIA has also a squelch functionality: when on (SQEn bit='1'), the differential output data are hold to the common mode output voltage if the signal detect signal is low. The differential data output may chatter when the squelch functionality is off even when the signal level is below the signal-detect threshold. In the stand-alone mode, the squelch functionality is enabled when the notSquelch pad is tied to ground. It is disabled when the pad is left unconnected or tied to VCC. In the I2C-controlled mode, the squelch functionality is enabled when the SQEn bit is set to '1', disabled when set to '0'. The timing diagram of the squelch function is shown below. The response time of the squelch circuit SQt is defined as shown in FIG. 13.

The channel incorporates an internal automatic gain control AGC circuit to increase the dynamic range. The AGC circuit consists of a variable gain amplifier and an automatic gain-control mechanism that limits the internal swing constant over a wide range of input powers. The set point of the AGC is determined by the rectified input signal amplitude (without the DC component). The AGC threshold is for example app. 100 µApp. In the I2C-controlled mode (legacy pad tied to GND), the AGC threshold is adjustable via the AGCTH bits.

Figure 14:
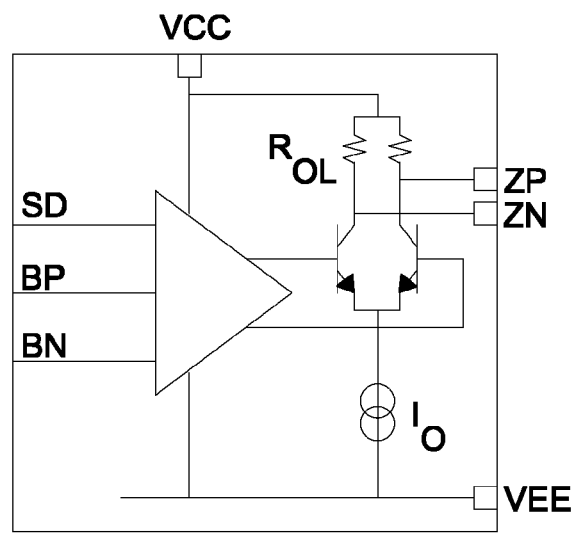
FIG. 14 equivalent circuit of the output stage of a receiver circuit according to the invention.

The differential output stage is compatible with CML standards (CML: current mode logic). The output stage switches the current IO between the two outputs (cf. FIG. 14). The load impedances at the two outputs should be matched to minimize switching noise. The polarity can be inverted with the following mechanism: in stand-alone mode, the output is inverted when the notInverted pad is tied to ground; and in I2C-controlled mode, the output is inverted when the INV bit is set to '1'. In the I2C-controlled mode a selectable output swing (for example 320 mVpp, 420 mVpp, 620 mVpp and 720 mVpp) is provided, whereby power consumption is increased and the device may be more prone to oscillations when operating with a larger swing size.

Figure 15:
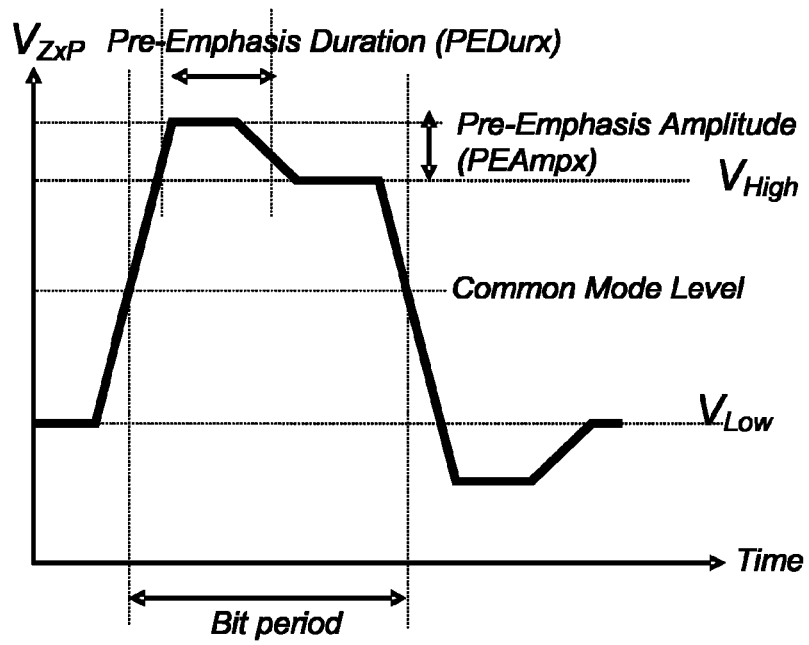
FIG. 15 output waveform with pre-emphasis.

In addition to a standard differential output drive, pre-emphasis of the output is provided. Pre-emphasis is a technique used to partially negate high frequency attenuation of signals travelling through PCB due to skin effect and dielectric loss. Pre-emphasis increases the high frequency component of a pulse by re-shaping it. This feature is enabled by setting the PEEN bit. Once enabled, the pre-emphasis circuit creates an overshoot characterized by its amplitude and duration. The pre-emphasis duration is set with the PEDur bits to a value between for example approx. 20 ps and 45 ps. The pre-emphasis amplitude is set with the PEAmp bits to a value between 0% and 40% of the single ended output swing under typical process and conditions. When there is no switching in subsequent bit periods, the voltage level stays at the logic 0 or logic 1 level. The pre-emphasis scheme does not require a reference clock. The amount of pre-emphasis that is needed is highly dependent on the characteristics of the trace. The designer will need to set the pre-emphasis based on the actual measurements from the board. FIG. 15 shows the output waveform with pre-emphasis.

In the Stand-alone mode (legacy pad left open or tied to VCC), the dual-band limiting TIA is configurable via the 4 following configuration bits: notInverted: if high, the channel has a normal polarity; if low, the channel is inverted; notSquelch: if high, the channel does not squelch; if low, the channel squelches when the peak-to-peak input current is below the squelch threshold; notHFRSSI: if high, the RSSI bandwidth is tied to the lower cut-off frequency, if low the bandwidth of the RSSI will be more than 100 kHz; notDualBW: if high, the chip will stay in the wide band mode independent of the RSSI pin voltage, if low, the chip will sense the voltage at the RSSI pin. If the sensed voltage is above the bandwidth selection threshold, the chip will enter the narrow band mode; and RSSI: when the chip operates in the dual band mode (notDualBW tied to ground), the RSSI pin voltage controls the wide band/narrow band switching mechanism.

The internal address space allows management function including the following features: ADC read out of the analog control/diagnostic value A/D conversion to allow a digital readout of the RSSI/die temperature; pre-emphasis circuit; adjustable output swing; adjustable decision circuit threshold (bit slicing circuit); temperature sensor; adjustable RF bandwidth and gain for an application specific performance/power optimization; and RSSI voltage alert.

Figure 16:
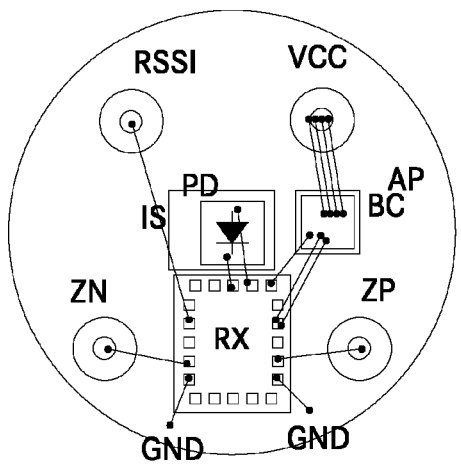
FIG. 16 TO-can arranged as receiving optical sub-assembly (ROSA) in stand-alone mode (analog interface used, control interface not used)

According to FIG. 16, a dual-band limiting TIA is arranged in stand-alone mode in a classic TO-can. Up to 2 GND connections are provided in order to properly ground the device. An isolated spacer may be arranged between the photodetector PD and the ground plane to reduce back coupling effect. The bondwires between the optional sandwich cap BC and the VCC pads are kept short, for example shorter than 300 μm. For the connection to the VCC pin, 4 bondwires are used. The length of the PD bondwires is kept short, for example between 600 μm and 800 μm.

Figure 17:
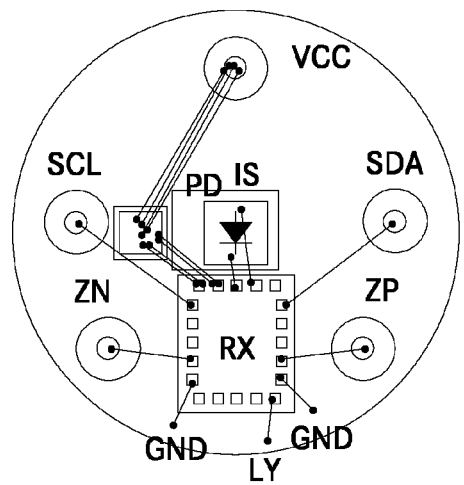
FIG. 17 TO-can arranged as receiving optical sub-assembly (ROSA) in I2C controlled mode (control interface used, analog interface not used)

According to FIG. 17, a dual-band limiting TIA is arranged in I2C controlled mode. The legacy pad LY is connected to ground. The SCL pad and SDA pad are connected to the respective PINs of the TO-can. A sandwich cap BC may be arranged and connected to the VCC pads as well as the VCC pin of the TO-can.

In summary, it is to be noted that an optical sub-assembly has been described that requires only a minimal number of external components and is flexibly as well as easily configurable for various applications.

The invention claimed is:

1. Optical sub-assembly, particularly TO-can, comprising:
   multiple pins extending from the outside to the inside of the optical sub-assembly;
   a light receiver or a light transmitter arranged inside the optical sub-assembly;
   a receiver circuit or a transmitter circuit arranged inside the optical sub-assembly and connected between the multiple pins and the light receiver respectively or the light transmitter, respectively, wherein the receiver circuit comprises a receiver communication interface in order to transform an output signal of the light receiver into a communication signal, wherein the transmitter circuit comprises a transmitter communication interface in order to transform a communication signal into an input signal of the light transmitter;
   a squelch circuit arranged in an input stage of the receiver circuit or the transmitter circuit, respectively;
      a control interface connected with the receiver circuit or the transmitter circuit, respectively, being arranged inside the optical sub-assembly, wherein the control interface is connected to two of the multiple pins of the optical sub-assembly; wherein
   the optical sub-assembly is configurable through the control interface in order to perform, in the case of the receiver circuit, a bit rate adjustment, a power consumption adjustment, and/or an output signal configuration, and in the case of the transmitter circuit, to perform a bit rate adjustment and/or an output signal configuration.

2. Optical sub-assembly according to claim 1, wherein an analog interface connected with the receiver circuit or the transmitter circuit, respectively, is arranged inside the optical sub-assembly, and wherein the analog interface is connected to one or more of the multiple pins of the optical sub-assembly.

3. Optical sub-assembly according to claim 2, wherein an analog to digital converter is arranged inside the optical sub-assembly in order to convert an analog measurement of an operational parameter of the optical sub-assembly into digital data.

4. Optical sub-assembly according to claim 1, wherein the control interface is an I2C control interface, which is connectable to two pins of the optical sub-assembly.

5. Optical sub-assembly according to claim 4, wherein in case of a transmitter circuit the analog interface is connected to one pin of the optical sub-assembly and provides for one of the following signals: a signal proportional to the current delivered to the light transmitter, a signal proportional to an average current delivered to the light transmitter, a signal proportional to a current of a feedback light receiver arranged nearby the light transmitter, or a signal proportional to a temperature measured by a temperature sensor.

6. Optical sub-assembly according to claim 4, wherein in case of a receiver circuit the analog interface is connected to one pin of the optical sub-assembly and provides for a signal proportional to the current of the light receiver or for a signal proportional to a temperature measured by a temperature sensor.

7. Optical sub-assembly according to claim 1, wherein in case of a transmitter circuit the analog interface is connected to one pin of the optical sub-assembly and provides for one of the following signals: a signal proportional to the current delivered to the light transmitter, a signal proportional to an average current delivered to the light transmitter, a signal proportional to a current of a feedback light receiver arranged nearby the light transmitter, or a signal proportional to a temperature measured by a temperature sensor.

8. Optical sub-assembly according to claim 7, wherein in case of a receiver circuit the analog interface is connected to one pin of the optical sub-assembly and provides for a signal proportional to the current of the light receiver or for a signal proportional to a temperature measured by a temperature sensor.

9. Optical sub-assembly according to claim 1, wherein in case of a receiver circuit the analog interface is connected to one pin of the optical sub-assembly and provides for a signal proportional to the current of the light receiver or for a signal proportional to a temperature measured by a temperature sensor.

10. Optical sub-assembly according to claim 1, wherein an analog to digital converter is arranged inside the optical sub-assembly in order to convert an analog measurement of an operational parameter of the optical sub-assembly into digital data.

11. Optical sub-assembly according to claim 10, wherein the analog measurement concerns a current in the light receiver respectively in the light transmitter, and/or a temperature of the light receiver or the light transmitter, respectively.

12. Optical sub-assembly according to claim 1, wherein operational parameters of the receiver circuit or of the transmitter circuit, respectively, are determined by connecting corresponding pads to ground with or without a resistor, and/or by writing appropriate control data on the control interface.

13. Optical sub-assembly according to claim 1, wherein the receiver circuit or the transmitter circuit, respectively, the analog interface, and the control interface are arranged on a single integrated chip.

* * * * *